United States Patent
Matsumaru et al.

(10) Patent No.: US 9,690,280 B2
(45) Date of Patent: Jun. 27, 2017

(54) POWER CONSUMPTION OUTPUT DEVICE AND SYSTEM FOR AN AUTOMATIC LATHE

(75) Inventors: Hajime Matsumaru, Saitama (JP);
Hitoshi Matsumoto, Saitama (JP);
Yutaka Shibui, Saitama (JP)

(73) Assignees: Citizen Watch Co., Ltd., Tokyo (JP);
Citizen Machinery Co., Ltd., Nagano (JP)

( * ) Notice: Subject to any disclaimer, the term of this patent is extended or adjusted under 35 U.S.C. 154(b) by 360 days.

(21) Appl. No.: 13/880,230

(22) PCT Filed: Oct. 19, 2011

(86) PCT No.: PCT/JP2011/074037
§ 371 (c)(1),
(2), (4) Date: Apr. 18, 2013

(87) PCT Pub. No.: WO2012/053544
PCT Pub. Date: Apr. 26, 2012

(65) Prior Publication Data
US 2013/0204417 A1   Aug. 8, 2013

(30) Foreign Application Priority Data
Oct. 22, 2010   (JP) .................................. 2010-237665

(51) Int. Cl.
*G05B 19/18*   (2006.01)
*B23B 25/06*   (2006.01)
(Continued)

(52) U.S. Cl.
CPC .............. *G05B 19/18* (2013.01); *B23B 25/06* (2013.01); *G05B 19/4063* (2013.01);
(Continued)

(58) Field of Classification Search
None
See application file for complete search history.

(56) References Cited

U.S. PATENT DOCUMENTS

| 6,526,360 B1 | 2/2003 | Ito et al. |
| 2010/0083800 A1 | 4/2010 | Kanaya et al. |
| 2011/0316335 A1* | 12/2011 | Bretschneider .... G05B 19/4063 307/11 |

FOREIGN PATENT DOCUMENTS

| JP | 04237301 | 8/1992 |
| JP | 200150993 | 2/2001 |

OTHER PUBLICATIONS

Translation of Kanaya et al. WIPO Publication No. WO2008117812 (2008), whole document.*
(Continued)

*Primary Examiner* — Mohammad Ali
*Assistant Examiner* — Bernard G Lindsay
(74) *Attorney, Agent, or Firm* — Howson & Howson LLP

(57) ABSTRACT

A power consumption output device for an apparatus that manufactures a plurality of products from a quantity of supplied material in a series of repeated cycles, includes a detector for detecting power consumption in a time period that includes at least the time needed for manufacturing all of the products that can be manufactured from a given quantity of supplied material, from the time at which the supply of the material to the apparatus commences to the time at which any remaining material is ejected, and delivers an output indicating power consumption per product by using the power consumption detected by the power detector and the number of products manufactured from the given quantity of supplied material. The device is thus capable of precisely calculating the electricity cost per product manufactured by an apparatus whose power consumption varies from one cycle of operation to another.

4 Claims, 6 Drawing Sheets

(51) Int. Cl.
*G05B 19/4063* (2006.01)
*G01R 22/10* (2006.01)
*G06Q 50/06* (2012.01)

(52) U.S. Cl.
CPC .... *G01R 22/10* (2013.01); *G05B 2219/31415* (2013.01); *G06Q 50/06* (2013.01)

(56) References Cited

OTHER PUBLICATIONS

English translation of Hata et al. Japanese Patent Publication No. 2002-062915.*
Written Opinion of the International Searching Authority dated Jan. 24, 2012, for international application No. PCT/JP/2011/074037.
Written Opinion of the International Searching Authority dated May 23, 2013, for international application No. PCT/JP/2011/074037.

* cited by examiner

POWER CONSUMPTION OUTPUT DEVICE AND SYSTEM FOR AN AUTOMATIC LATHE

TECHNICAL FIELD

The present invention relates to a power consumption output device for an apparatus.

BACKGROUND ART

There is a conventional demand to find out electricity cost per manufactured product accurately in terms of effective utilization of electricity or the like.

For example, in an apparatus that manufactures a large number of products by repeatedly carrying out a same operation, it is known to display power consumption of the apparatus in each cycle of the repetitive operation.

In fact, it is known in the prior art to output power consumption per cycle of repetitive operation to a display or the like by detecting power consumption of the apparatus or electrically-operated instruments included therein in a cycle of the repetitive operation, or detecting power consumption of the apparatus or the electrically-operated instruments in a predetermined period and the number of cycles of the repetitive operation carried out within the predetermined period (see Patent Literature 1, for example).

CITATION LIST

Patent Literature

Patent Literature 1: Japanese Patent No. 3088403 (all pages, all figures)

SUMMARY OF INVENTION

Technical Problem

Unfortunately, in an apparatus such as an automatic lathe which sequentially feeds and cuts an elongated material to manufacture a large number of products, for example, because the elongated material gradually becomes shorter, the electric power consumed in feeding the elongated material or rotationally driving a main spindle grasping the elongated material gradually changes. Thus, power consumption in a cycle of repetitive operation changes with respect to each product.

Also, if electric power is consumed while supplying a material or ejecting a remaining material, such power consumption cannot be detected when each product is manufactured. Thus, if an operation of supplying an elongated material or adjusting/replacing a cutting tool is automated, power consumption during such operation cannot be detected when each product is manufactured.

Therefore, there is a problem in the prior art that electricity cost per product cannot be found out accurately in an apparatus which includes an electrically-operated instrument whose power consumption changes in each cycle of repetitive operation, an apparatus whose power consumption occurs or changes in a cycle other than a manufacturing cycle, such as ejecting a remaining material, supplying a material, and adjusting/replacing a tool, or an apparatus which consumes electric power randomly.

Also, it is common that a plurality of materials is repeatedly supplied to an apparatus and a large number of products are manufactured in one manufacturing lot. In this case, the number of times to supply a material or adjust/replace a tool, for example, differs depending on how many products are manufactured in one manufacturing lot. Thus, there is a problem in the prior art that electricity cost per product manufactured in one manufacturing lot cannot be found out accurately.

Solution to Problem

In order to address the above described problems, according to a first aspect of the present invention, there is provided a power consumption output device for an apparatus that includes electrically-operated instruments related to manufacturing products and manufactures products from a supplied material, the device including: power detection means for detecting power consumption of the electrically-operated instruments or the whole apparatus during a predetermined processing operation of manufacturing products; and output means for calculating and outputting electric energy consumption of the electrically-operated instruments or the whole apparatus per product manufactured with the processing operation by using the power consumption detected by the power detection means and the number of products manufactured with the processing operation.

According to a second aspect of the present invention, the power detection means detects power consumption of the whole apparatus or the electrically-operated instruments from the beginning to the end of a processing operation on a single material, and the output means calculates and outputs electric energy consumption of the electrically-operated instruments or the whole apparatus per product manufactured from the single material by using the power consumption detected by the power detection means and the number of products manufactured from the single material.

According to a third aspect of the present invention, the power detection means detects power consumption of the apparatus or the electrically-operated instruments from the beginning to the end of manufacturing all products that are manufactured in one manufacturing lot, and the output means calculates and outputs average electric energy consumption of the electrically-operated instruments or the whole apparatus per product manufactured in one manufacturing lot by using the power consumption detected by the power detection means and the number of products manufactured in one manufacturing lot.

According to a fourth aspect of the present invention, a plurality of the electrically-operated instruments include supplying means for supplying a material to the apparatus.

According to a fifth aspect of the present invention, the apparatus is an automatic lathe that sequentially feeds and cuts an elongated material.

According to a sixth aspect of the present invention, the device comprises count means for counting the number of products manufactured from the single material or in one manufacturing lot.

According to a seventh aspect of the present invention, the device includes display means for displaying the power consumption per product.

According to an eighth aspect of the present invention, there is provided a processing system for manufacturing products from an elongated material, the system including: an automatic lathe capable of sequentially feeding the elongated material and manufacturing a large number of products; a material supplying device for sequentially supplying the elongated material to the automatic lathe; control means for controlling the automatic lathe and the material supplying device, and the power consumption output device of any of the first to seventh aspects.

Advantageous Effects of Invention

According to the power consumption output device of the first aspect of the present invention, it is possible to accurately find out electricity cost per product on the basis of the electric energy consumption of the electrically-operated instruments or the whole apparatus.

According to the power consumption output device of the second aspect of the present invention, even when the power consumption in a cycle of repetitive operation changes with respect to each product, it is possible to output the electric energy consumption per product on the basis of the electric energy consumption from the beginning to the end of a processing operation on a single material and the number of products manufactured from the single material, and to accurately find out the electricity cost per product manufactured from the single material.

The period from the beginning to the end of the processing operation may be set as needed for calculating the electricity cost per product.

According to the power consumption output device of the third aspect of the present invention, when a large number of products are manufactured in one manufacturing lot, the electric energy consumption per product can be output on the basis of the electric energy consumption from the beginning to the end of manufacturing all products in one manufacturing lot, including the electric power consumed in a cycle other than a manufacturing cycle, and the number of products manufactured in one manufacturing lot. Thus, it is possible to accurately find out electricity cost per product manufactured in one manufacturing lot.

According to the configuration of the fourth and fifth aspects of the present invention, it is possible to accurately find out electricity cost per product in an apparatus which includes supplying means that operates in a cycle other than a manufacturing cycle, and an automatic lathe.

According to the configuration of the sixth aspect of the present invention, it is possible to easily calculate electric energy consumption per product even when the number of products manufactured from a single material or in one manufacturing lot is not defined in advance.

According to the configuration of the seventh aspect of the present invention, it is possible to display the power consumption per product (including electric power consumed in replacing a material) on display means so as to be easily checked by an operator or the like.

According to the processing system of the eighth aspect of the present invention, it is possible to automatically manufacture a large number of products as well as to accurately find out electricity cost for each product.

DESCRIPTION OF EMBODIMENTS

Embodiments

Figure 1:
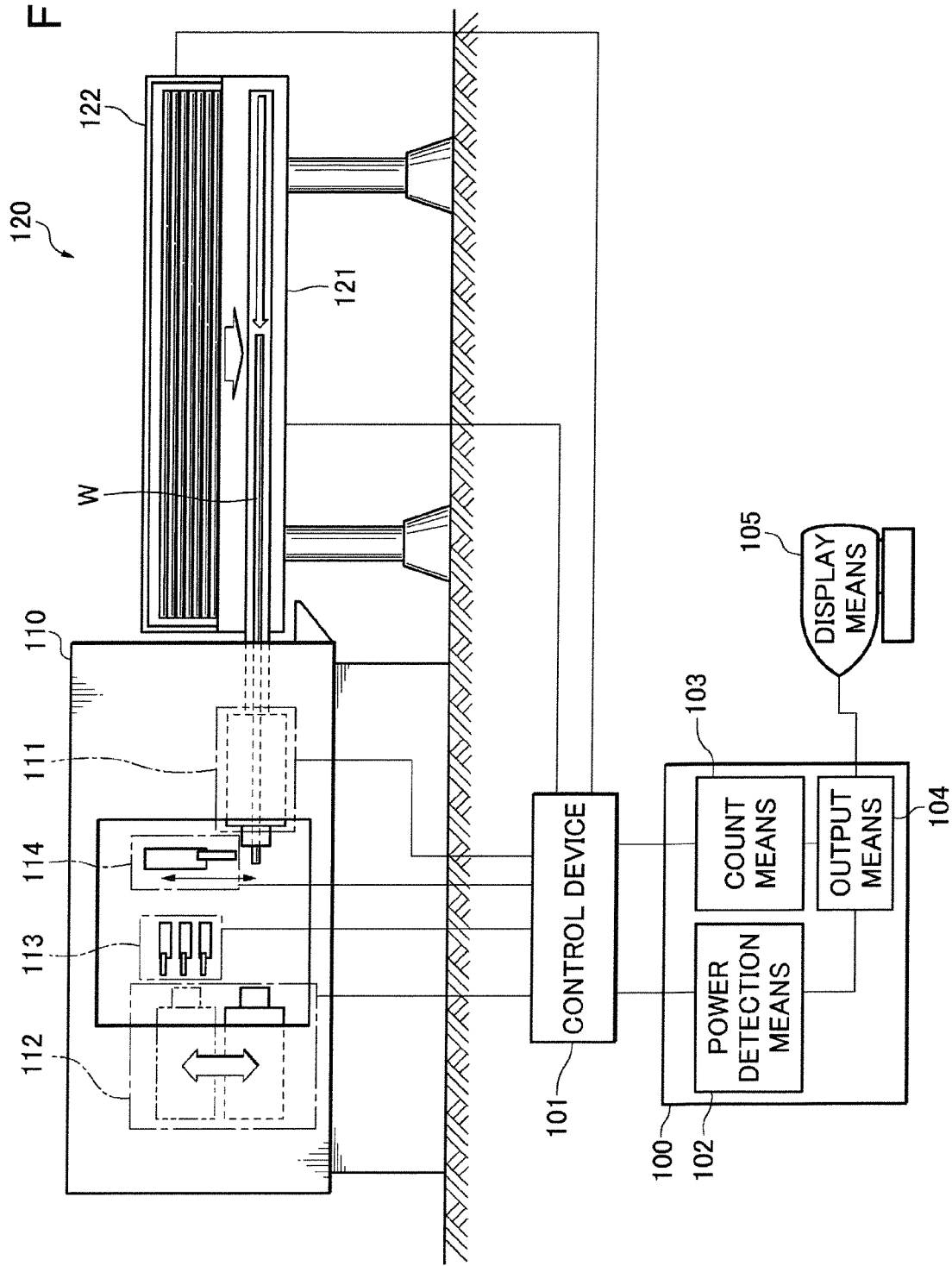
FIG. 1 is an explanatory view of a power consumption output device of one embodiment of the present invention.

FIG. 1 is a schematic explanatory view in which a power consumption output device of one embodiment of the present invention is applied to an automatic lathe 110 which sequentially feeds an elongated material and manufactures a large number of products by cutting the elongated material.

The automatic lathe 110 includes a main spindle 111 which chucks an elongated material W and rotates, a backside spindle 112 which is provided so as confront the main spindle and rotates, a backside tool 113 which processes a material chucked by the backside spindle 112, a main tool 114 which processes the elongated material W chucked by the main spindle 111, etc., and is equipped with a material supplying device 120 which supplies the elongated material W to the main spindle 111.

The main spindle 111 rotates, chucks the elongated material W, and moves in an axial direction, if configured to be able to do so. The automatic lathe 110 includes electrically-operated instruments such as a motor and an actuator that are the driving source of the main spindle 111 and drive control means (such as a motor amplifier) for driving and controlling the driving source.

The backside spindle 112 rotates, chucks a material separated from the elongated material W, and moves in the axial direction as well as in a direction orthogonal to the axial direction (shown by the arrow in FIG. 1). The automatic lathe 110 includes electrically-operated instruments such as a motor and an actuator that are the driving source of the backside spindle 112 and drive control means (such as a motor amplifier) for driving and controlling the driving source.

Each of the main tool 114 and the backside tool 113 includes a tool base and a plurality of tools provided on the tool base, and is able to select from the plurality of tools. The main tool 114 and the backside tool 113 also move in the axial direction of the elongated material W and a direction orthogonal to the axial direction, replace a tool to use for processing a material, and rotationally drive a rotating tool if such tool is included. The automatic lathe 110 includes electrically-operated instruments such as a motor and an actuator that are the driving source of the main tool 114 and the backside tool 113 and drive control means (such as a motor amplifier) for driving and controlling the driving source.

The material supplying device 120 as an electrically-operated instrument includes, for example, a material feeding mechanism 121 for feeding a single elongated material W to the main spindle 111, and a material supplying mechanism 122 for supplying the elongated material W to the material feeding mechanism 121 one at a time.

Also, a control device 101 is provided for comprehensively controlling how each of the above described electrically-operated instruments is driven. The control device 101 itself is also an electrically-operated instrument.

Even though not shown in the drawings, the electrically-operated instruments of the apparatus also include a pump for supplying cutting fluid and a motor and an actuator of chip removing means and product discharging means. Furthermore, the electrically-operated instruments of the apparatus include electrically-operated instruments of safety door opening and closing means, illuminating means, or any other means provided in or on the automatic lathe 110 or the material supplying device 120 in relation with manufacturing products.

The control device 101 is connected with each of the electrically-operated instruments that drive the main spindle 111, the backside spindle 112, the backside tool 113, the main tool 114, the material feeding mechanism 121 and the material supplying mechanism 122 in a manner that signals can be transmitted. The control device 101 instructs each of the electrically-operated instruments to carry out various operations needed for manufacturing products, and receives power consumption information transmitted from each of the electrically-operated instruments.

For example, in case of an electrically-operated instrument whose load fluctuate frequently, such as a motor or an actuator of the main spindle, an electric current value detected in real time can be transmitted to the control device 101 as power consumption information.

In case of an electrically-operated instrument in which both voltage and current fluctuate, a voltage value and a current value detected in real time, or the product of the voltage value and the current value, can be transmitted as power consumption information.

In case of an electrically-operated instrument whose power consumption per hour is substantially constant, such as a cutting oil pump and a cooling fan, only the rated power consumption information of the instrument may be transmitted to the control device 101 as power consumption information. Furthermore, the power consumption information of an electrically-operated instrument whose power consumption per hour is substantially constant and known in advance may be stored in the control device 101 as its database.

A power consumption output device 100 includes power detection means 102, count means 103, and output means 104. The power consumption output device 100 receives from the control device 101 the power consumption information as well as product manufacturing information of each of the electrically-operated instruments (including the control device 101 itself), and processes and displays the received information on display means 105.

The power detection means 102 receives from the control device 101 the power consumption information of each of the electrically-operated instruments, information indicating the beginning and end of processing on a single material, information indicating the beginning and end of manufacturing in one manufacturing lot, etc., and calculates and outputs on the output means 104 the electric energy consumption of each of the electrically-operated instruments as well as the total electric energy consumption of the electrically-operated instruments.

Figure 2:
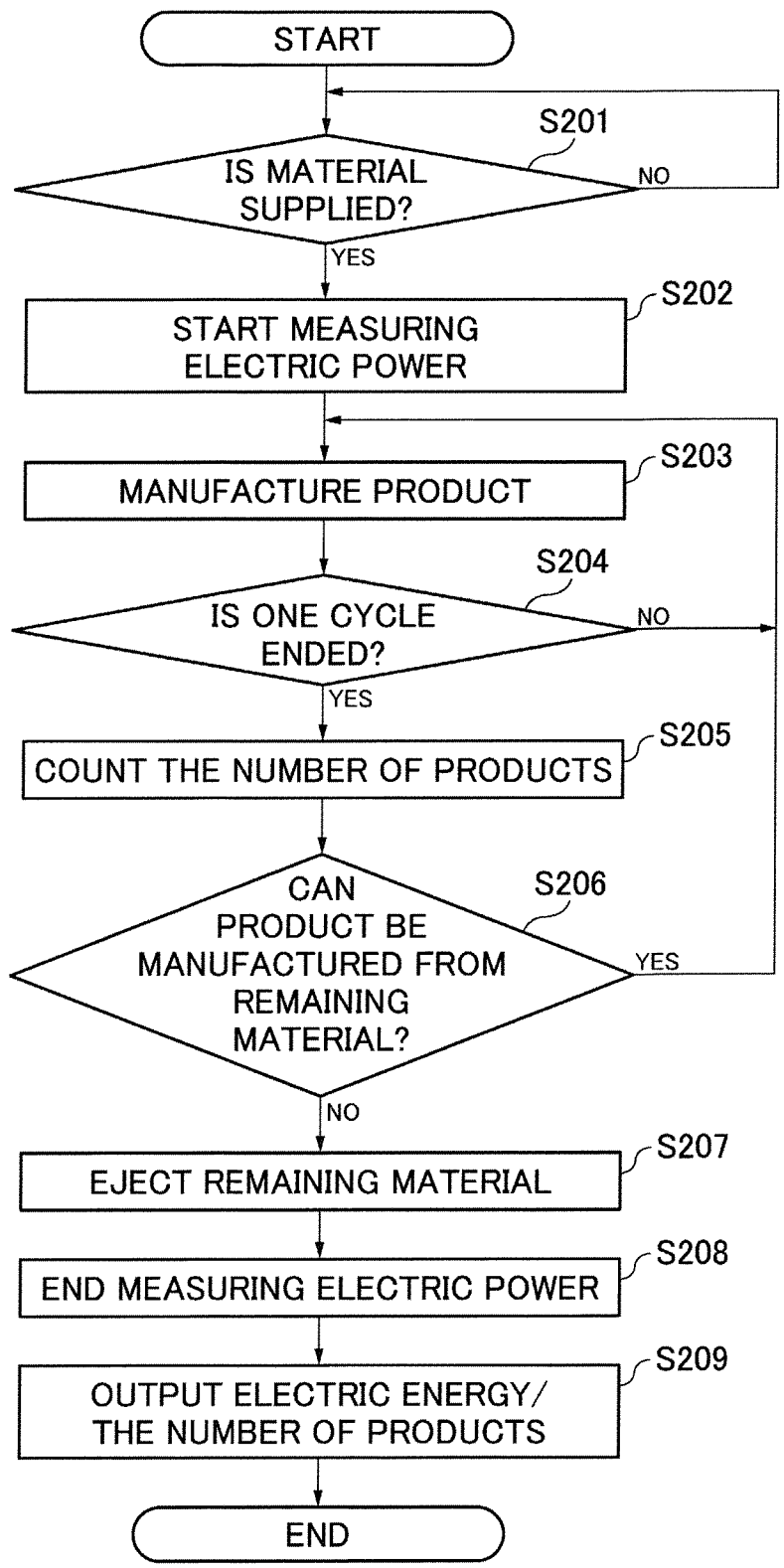
FIG. 2 is a flow chart showing a workflow of the power consumption output device of one embodiment of the present invention.

A sample workflow of how the power consumption output device 100 as one embodiment of the present invention outputs average electric energy consumption per product when a plurality of products are manufactured from an elongated material W, which is an example of a single material, will now be described on the basis of FIGS. 1 and 2.

Firstly, an instruction for starting a processing operation is given to the control device 101 of the automatic lathe 110, and the material supplying device 120 starts supplying the elongated material W to the main spindle 111.

When the material supplying device 120 starts supplying the material, the power detection means 102 starts measuring the power consumption of each electrically-operated instrument (S201, S202).

The supplied elongated material W is then processed to a product on the basis of instructions from the control device 101 (S203).

A cycle of processing operation includes, for example: chucking the elongated material W by the main spindle 111 so that a predetermined amount of the elongated material W protrudes from the main spindle 111; rotationally driving the main spindle 111; cutting the protruding portion of the elongated material W by moving the main tool 114 in a forward and backward direction or the axial direction; and finally cutting off the protruding portion from the elongated material W by a cut-off bite of the main tool 114 if only the main tool 114 is used for cutting work (S204).

If the backside tool 113 is also used, after the completion of the above described cutting work with the main tool 114, a cycle of processing operation also includes: chucking the elongated material W by the backside spindle 112; cutting off the protruding portion from the elongated material W by the cut-off bite of the main tool 114; moving the backside spindle 112 to the position opposing the backside tool 113; rotationally driving the backside spindle 112; performing cutting work by moving the backside tool 113 in a forward and backward direction or the axial direction; and finally releasing the chuck by the backside spindle 112 to eject a manufactured product (S204).

When a cycle of processing operation completes, the count means 103 counts the number of products (S205).

It is then determined whether the next product can be manufactured from the remaining elongated material W (remaining material). If it can, the remaining elongated material W (remaining material) is axially moved so that the predetermined amount thereof protrudes from the main spindle 111, and the above described processing operation starts again (S206).

If the next product cannot be manufactured from the remaining elongated material W (remaining material), the remaining elongated material W (remaining material) is ejected from the main spindle 111 (S207), and the power detection means 102 stops measuring the power consumption of each of the electrically-operated instruments (S208).

On the basis of the power consumption measured by the power detection means 102, the output means 104 calculates the electric energy consumption of the whole apparatus during the processing operation, divides the electric energy consumption by the number of products counted by the count means 103 to obtain the average electric energy consumption per product, and outputs the average electric energy consumption to the display means 105 (S209).

If the number of products that can be manufactured from a single material is known in advance, that number may be preliminarily stored in the output means 104, for example, instead of providing the count means 103 to count the number of products.

Figure 3:
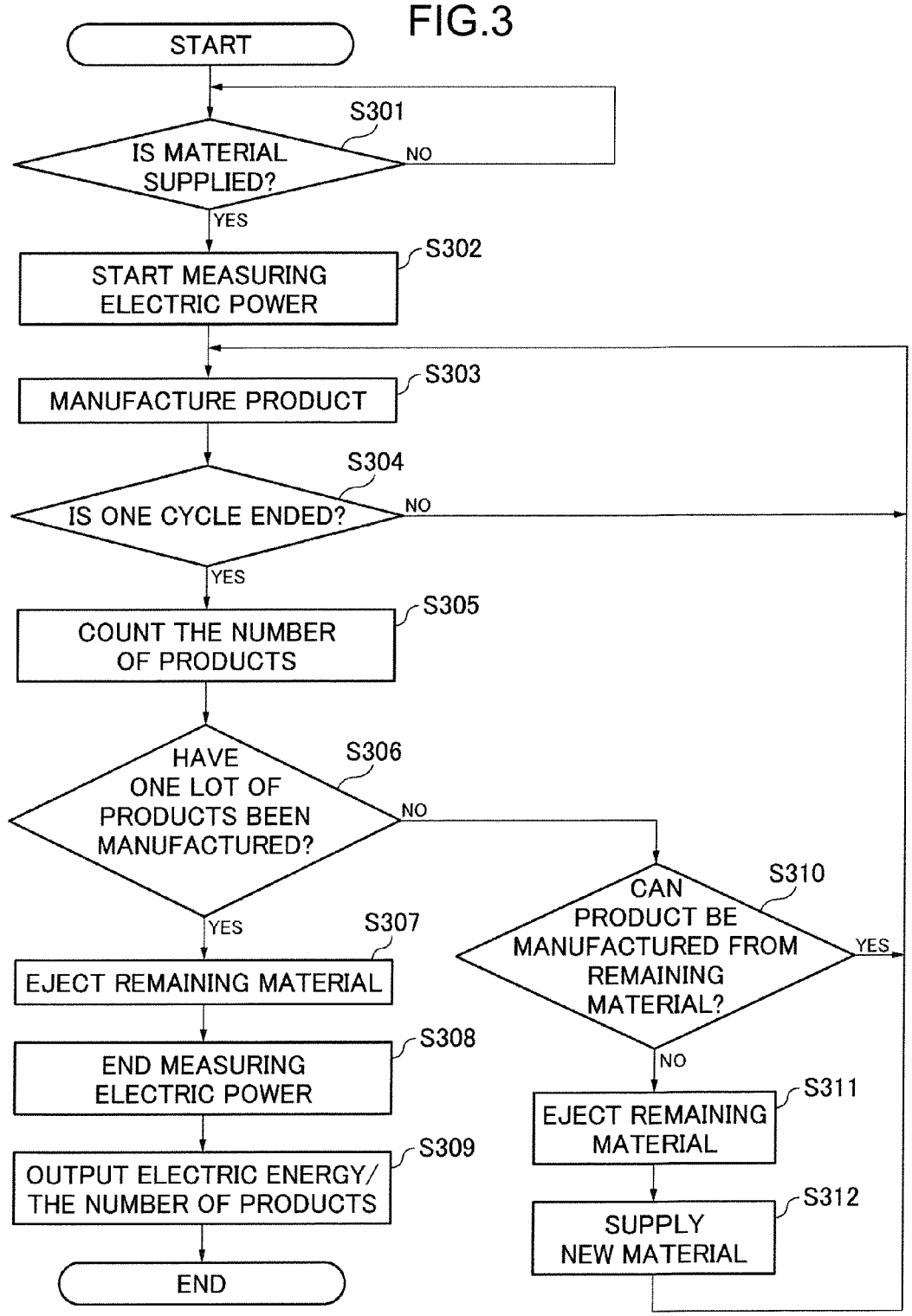
FIG. 3 is a flow chart showing another workflow of a power consumption output device of one embodiment of the present invention.

A sample workflow of how the power consumption output device 100 as one embodiment of the present invention outputs average electric energy consumption per product manufactured in one manufacturing lot will now be described on the basis of FIGS. 1 and 3.

As with the above described workflow, an instruction for starting a processing operation is given to the control device 101 of the automatic lathe 110, a cycle of the processing operation completes, and the count means 103 counts the number of products (S301-S305).

After the number of products is counted by the count means 103, it is determined whether the number of products that are supposed to be manufactured in one manufacturing lot has been reached (S306). If it hasn't, then it is determined whether the next product can be manufactured from the remaining elongated material W (remaining material) (S310).

If it can, then the remaining elongated material W (remaining material) is axially moved so that the predetermined amount thereof protrudes from the main spindle 111, and the above described processing operation starts again If the next product cannot be manufactured from the remaining elongated material W (remaining material), the remaining elongated material W (remaining material) is ejected from the main spindle 111 (S311), and another elongated material W is supplied from the material supplying device 120 to the main spindle 111 (S312) so that the next product can be manufactured.

If the number of products counted by the count means 103 is equal to the number of products that are supposed to be manufactured in one manufacturing lot, the remaining elongated material W (remaining material) is ejected from the main spindle 111 (S307), and the power detection means 102 stops measuring the power consumption of each of the electrically-operated instruments (S308).

On the basis of the power consumption measured by the power detection means 102, the output means 104 calculates the electric energy consumption of the whole apparatus during the processing operation, divides the electric energy consumption by the number of products counted by the count means 103 to obtain the average electric energy consumption per product, and outputs the average electric energy consumption to the display means 105 (S309).

If the remaining material can be reused for manufacturing another product, or the next product is manufactured from a completely different material, for example, the remaining material needs to be replaced along with the stock of materials. In that case, the power consumption may be calculated without counting on the step of ejecting the remaining material.

In either of the above described workflows, the output means 104 may calculate and output to the display means 105 the average electric energy consumption per product on the basis of each or a functionally created group of the electrically-operated instruments.

The display means 105 is visually recognizable means, such as a display of the control device 101 provided on the automatic lathe 110. Instead of outputting to the display 105, the output means 104 may output information to printing means, recording means such as a recording medium, communication means, or the like. Also, the output means 104 may output information to a plurality of means, including the display means 105, simultaneously or selectively.

According to the above described configuration, it is possible to output the average electric energy consumption per product manufactured from a single material or in one manufacturing lot, even if the apparatus includes an electrically-operated instrument whose power consumption changes in each cycle of product manufacturing operation, whose power consumption changes in a cycle other than a manufacturing cycle, or whose power consumption changes randomly, and to accurately find out electricity cost per product manufactured from a single material or in one manufacturing lot.

The power detection means 102 may have an additional function of directly outputting to and displaying in real time on the display means 105 the power consumption information of the electrically-operated instruments received from the control device 101 on the basis of either each or a functionally created group of the electrically-operated instruments, or the whole apparatus. Also, the count means 103 may have an additional function of receiving product manufacturing information from the control device 101 and directly outputting to and displaying in real time on the display means 105 the number of manufactured products.

Also, even though the control device 101, the power consumption output device 100, the output means 104 and the display means 105 are illustrated in FIG. 1 as separate functional blocks, their physical configuration may be designed as appropriate. For example, all of these devices and means may be physically provided in one chassis or embedded in the automatic lathe 110.

Figure 6:
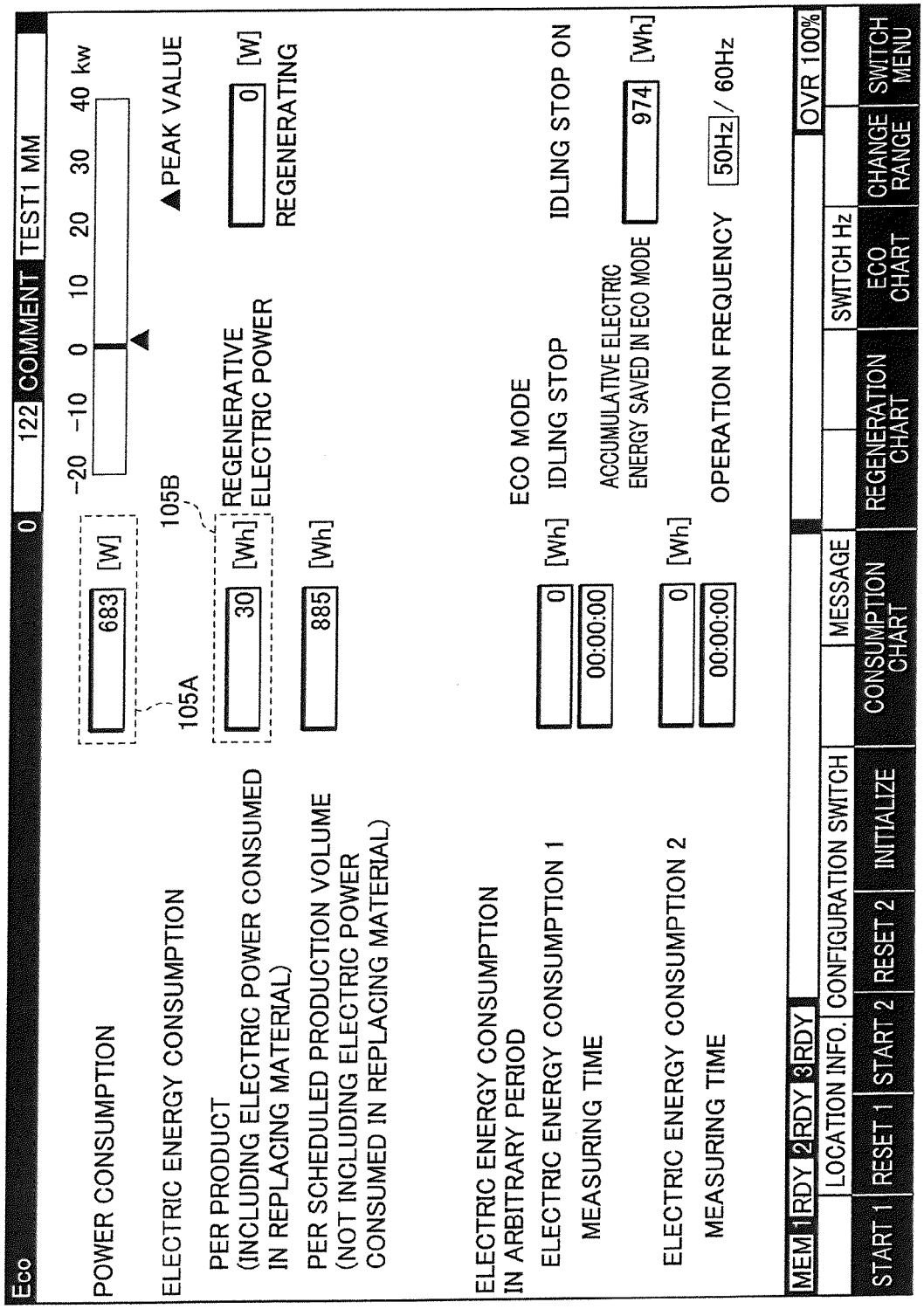
FIG. 6 is a conceptual view illustrating one example of a display screen of the power consumption output device of one embodiment of the present invention.

The display means 105 may include a display device capable of displaying the electric energy consumption of the whole apparatus as well as the electric energy consumption per product, as shown in FIG. 6.

A screen of the display means 105 includes a power consumption display portion 105A which displays the power consumption of the whole automatic lathe in real time, for example, and an electric energy consumption display portion 105B which displays electric energy consumption per product. For example, when the electric energy consumption for each of a plurality of products manufactured by processing a single elongated material is calculated, it is possible to display in the electric energy consumption display portion 105B nothing while a first elongated material is processed, and display the power consumption calculated on the previous material while a second or later elongated material is processed. Likewise, when the power consumption per product is calculated on the basis of the predetermined number of products, the power consumption per product can be displayed after a first lot of products have been manufactured (or staring from the beginning of manufacturing a second lot of products). The display means 105 may also work as an input/output console for controlling the control device 101 and displaying various kinds of information about the whole apparatus, and may be a display embedded in the control device 101.

Even though in the above described embodiment the power consumption output device 100 is applied to an apparatus in which products are manufactured by the automatic lathes 110, the power consumption output device 100 may be applied to any apparatus that includes an electrically-operated instrument related to manufacturing products.

(Variations of the Workflows)

Figure 4:
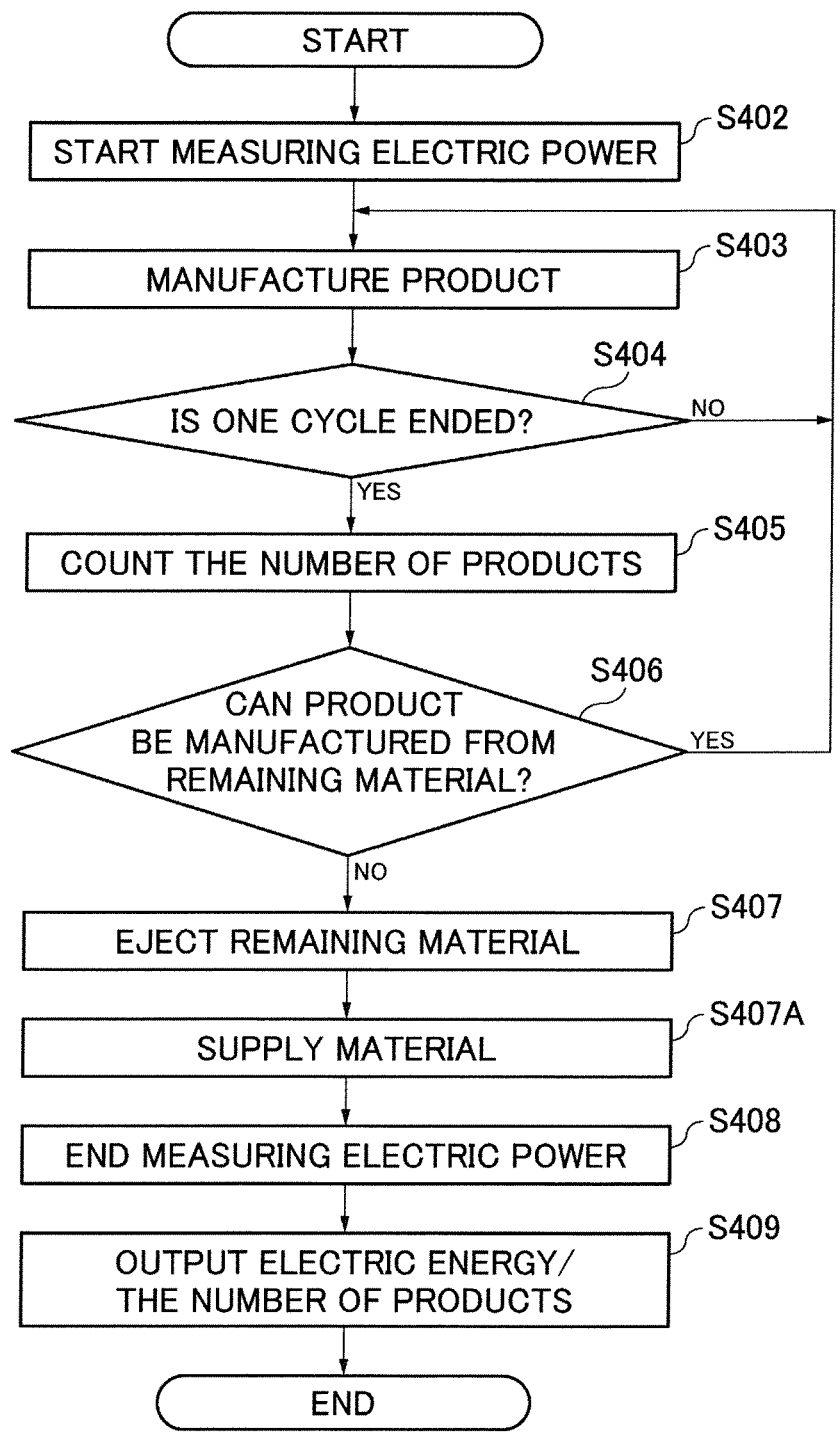
FIG. 4 is a flow chart showing a variation of the workflow of the power consumption output device of one embodiment of the present invention.
Figure 5:
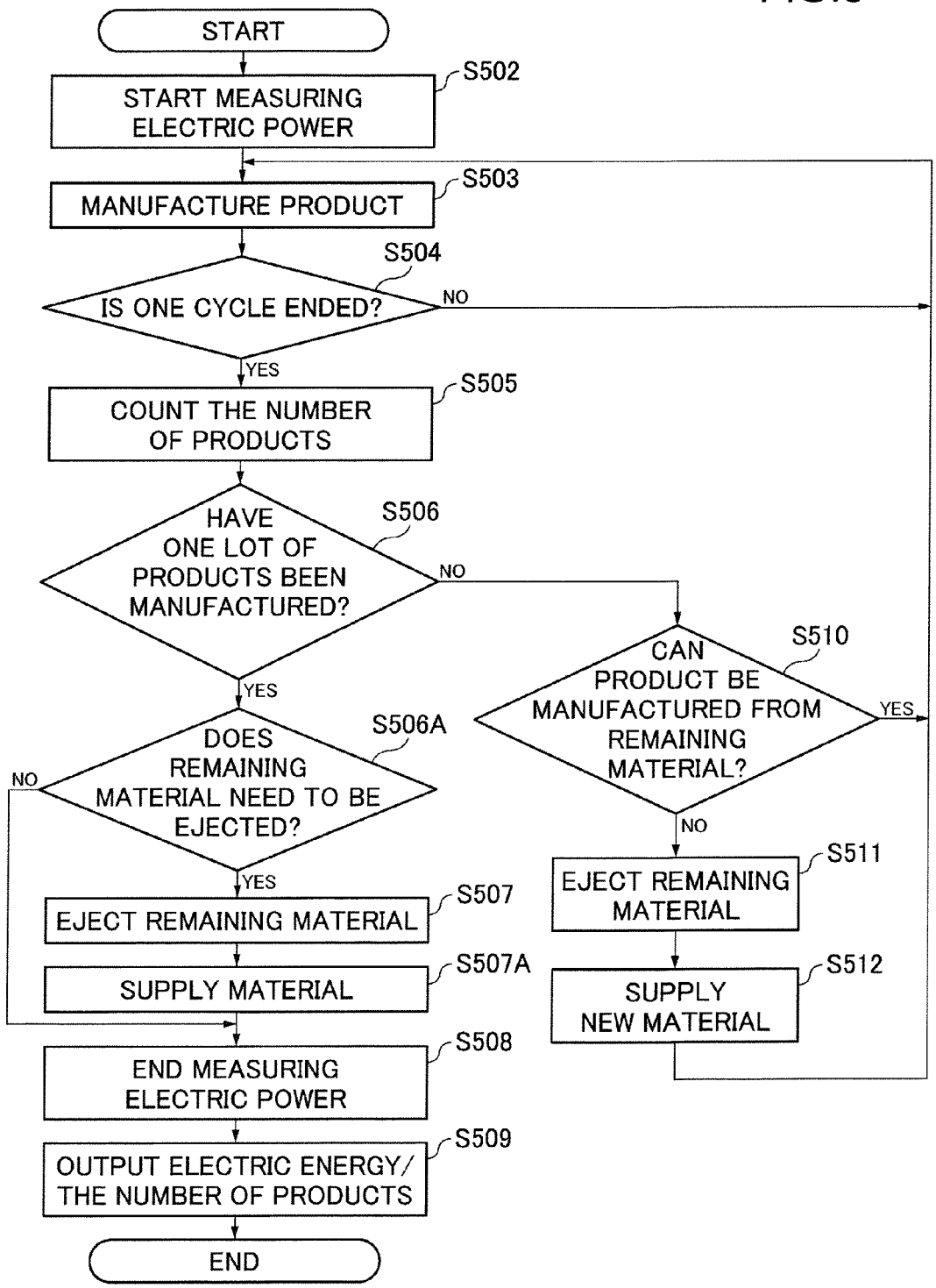
FIG. 5 is a flow chart showing another variation of the workflow of the power consumption output device of one embodiment of the present invention.

Variations of the workflows of the power consumption output device 100 described above with reference to FIGS. 2 and 3 will now be described with reference to FIGS. 4 and 5. In the description below, the same steps as those indicated by reference numerals in the 200s and 300s in FIGS. 2 and 3 will be indicated by corresponding reference numerals in the 400s and the 500s, and detailed description of these steps will be avoided. The workflows shown in FIGS. 4 and 5 are variations of the workflows shown in FIGS. 2 and 3, respectively. As shown in FIG. 4, the workflow of this variation includes a step of supplying a material (S407A) between the step of ejecting a remaining material (S407) and the step of measuring electric power (S408).

If an elongated material is already inserted into the lathe (either manually or automatically, depending on whether the elongated material is a first material or not, for example) at the beginning of a processing operation, for example, the period of the processing operation on a single material can be adapted to start at the beginning of processing the elongated material and end when the next material is supplied. In this case, measuring of electric power can be started at the beginning of processing the elongated material and ended when a remaining material is ejected and a new material is supplied, as shown in the workflow of this variation.

As shown in FIG. 5, the workflow of this variation includes a step of determining whether a remaining material needs to be ejected (S506A) between the step of determining whether one lot of products have been manufactured (S506) and the step of ejecting a remaining material (S507).

The workflow of this variation also includes a step of supplying a material (S507A) between the step of ejecting a remaining material (S507) and the step of measuring electric power (S508).

As with the previous workflow, if an elongated material is already inserted into the lathe (either manually or automatically, depending on whether the elongated material is a first material or not, for example) at the beginning of a processing operation, for example, measuring of electric power can be started at the beginning of processing the elongated material, as shown in the workflow of this variation. But a remaining material may be ejected (if the remaining material is too short or the next processing operation will be started using a different material, for example) or not (if the manufacturing of the next lot of products will be started using the remaining material, for example). Thus, if the remaining material is not ejected, measuring of electric power can be stopped immediately. If a material needs to be switched, measuring of electric power may be stopped after a new material is supplied.

REFERENCE SIGNS LIST

100 Power consumption output device
101 Control device
102 Power detection means
103 Count means
104 Output means
105 Display means
110 Automatic lathe
111 Main spindle
112 Backside spindle
113 Backside tool
114 Main tool
120 Material supplying device
121 Material feeding mechanism
122 Material supplying mechanism
W Elongated material

The invention claimed is:

1. A processing system for manufacturing products from a supplied unit of elongated material by cutting the unit of elongated material, said processing system comprising an automatic lathe that includes electrically-operated instruments related to manufacturing said products and that sequentially feeds and cuts the supplied unit of elongated material to produce a plurality of products therefrom, a material supplying device for sequentially supplying the unit of elongated material to the automatic lathe, control means for controlling the automatic lathe and the material supplying device, and a power consumption output device of the automatic lathe, said supplied unit of elongated material becoming shorter in length as said supplied unit is sequentially fed and cut, the power consumption output device comprising:

power detection means for detecting power consumption of the electrically-operated instruments or the whole automatic lathe during a predetermined processing operation wherein, from the beginning to the end of the processing operation, a supplied unit of elongated material is sequentially fed and cut to produce said plurality of products therefrom, and sequentially becomes shorter at least by an amount equal to the length of each product cut therefrom, and wherein the power consumed by said electrically-operated instruments, and by the whole automatic lathe, changes from one product to another as a result of the shortening of the length of said supplied unit of elongated material as each said product is cut therefrom; and output means for calculating and outputting average electric energy consumption of the electrically-operated instruments or the whole automatic lathe per product manufactured with the processing operation from said supplied unit of elongated material, the calculation carried out by said output means being based on power consumption and a number of products, said power consumption being power consumption detected by the power detection means, that changes from one product to another as a result of the shortening of the length of said supplied unit of elongated material as said supplied unit is sequentially fed and cut, and said number of products being the number of products manufactured in said processing operation, wherein:

the power detection means detects power consumption of the whole automatic lathe or the electrically-operated instruments from the beginning to the end of a processing operation on a single supplied unit of said elongated material;

the output means calculates and outputs electric energy consumption of the electrically-operated instruments or the whole automatic lathe, per product manufactured from said single supplied unit of elongated material by using the power consumption detected by the power detection means and the number of products manufactured from the said single supplied unit of elongated material, and said control means determines when a product can no longer be made from the remaining material in said supplied unit of elongated material, causes said power detection means to continue to detect said power consumption until a product can no longer be made from the remaining material in said supplied unit of elongated material, and, when it determines that a product can no longer be made from said remaining material, causes said power detection means to stop detecting power consumption and causes said automatic lathe to elect said remaining material.

2. The processing system according to claim 1, wherein the electrically-operated instruments include supplying means for supplying said elongated material to the automatic lathe.

3. The power processing system according to claim 1, wherein the power consumption output device comprises display means for displaying the power consumption per product.

4. The processing system according to claim 1, including count means for counting the number of products manufactured from said single unit of elongated material.

* * * * *